US011251066B2

(12) United States Patent
Kim

(10) Patent No.: US 11,251,066 B2
(45) Date of Patent: Feb. 15, 2022

(54) TRANSFER UNIT AND SUBSTRATE PROCESSING APPARATUS INCLUDING THE SAME

(71) Applicant: SEMES CO., LTD., Chungcheongnam-do (KR)

(72) Inventor: Hyung Joon Kim, Pyeongtaek-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 489 days.

(21) Appl. No.: 16/411,195

(22) Filed: May 14, 2019

(65) Prior Publication Data
US 2019/0355611 A1 Nov. 21, 2019

(30) Foreign Application Priority Data

May 17, 2018 (KR) .................... 10-2018-0056275

(51) Int. Cl.
*H01L 21/687* (2006.01)
*H01J 37/32* (2006.01)
(Continued)

(52) U.S. Cl.
CPC ........ *H01L 21/68735* (2013.01); *H01J 37/20* (2013.01); *H01J 37/32642* (2013.01);
(Continued)

(58) Field of Classification Search
CPC ........... H01L 21/68707; H01L 21/6833; H01L 21/67017; H01L 21/68735;
(Continued)

(56) References Cited

U.S. PATENT DOCUMENTS 9,911,636 B1 * 3/2018 Weed .................... H01J 37/185
2010/0216313 A1 * 8/2010 Iwai .................. H01L 21/67092
438/729
(Continued)

FOREIGN PATENT DOCUMENTS

JP 3516700 B 1/2004
JP 4060185 B 12/2007
(Continued)

OTHER PUBLICATIONS

Korean Patent Office, Notice of Allowance dated Jan. 19, 2021.
Korean Patent Office, Office action dated Nov. 15, 2019.
Korean Patent Office, Office Action dated Jul. 29, 2020.

*Primary Examiner* — Kevin J Comber
(74) *Attorney, Agent, or Firm* — Li & Cai Intellectual Property (USA) Office

(57) ABSTRACT

The substrate processing apparatus includes a processing unit and a transfer unit that transfers a substrate into the processing unit. The processing unit includes a support unit that supports the substrate in the process chamber. The support unit includes a support on which the substrate is placed and an edge ring that surrounds the substrate placed on the support and that is detachable from the support. The transfer unit includes a hand having a top side on which the substrate is placed and a fixing member that is provided in the hand and that fixes the edge ring to a bottom side of the hand with an electrostatic force. The fixing member includes a first electrode and second electrode, and the transfer unit further includes a voltage applying device that applies voltages of different polarities to the first electrode and the second electrode.

18 Claims, 12 Drawing Sheets

(51) Int. Cl.
*H01L 21/683* (2006.01)
*H01J 37/20* (2006.01)
*H01L 21/3065* (2006.01)

(52) U.S. Cl.
CPC .... *H01J 37/32715* (2013.01); *H01L 21/6833* (2013.01); *H01L 21/3065* (2013.01)

(58) Field of Classification Search
CPC ......... H01L 21/67742; H01L 21/67109; H01L 21/67748; H01L 21/3065; H01J 37/32715; H01J 37/20; H01J 37/32642
USPC ....................................................... 361/234
See application file for complete search history.

(56) References Cited

U.S. PATENT DOCUMENTS

2016/0211166 A1* 7/2016 Yan ................... H01L 21/68742
2016/0329227 A1* 11/2016 Hashimoto ....... H01L 21/67781

FOREIGN PATENT DOCUMENTS

| | | | |
|---|---|---|---|
| JP | 4151749 B2 * | 9/2008 | ........ H01J 37/32623 |
| JP | 2009-094436 A | 4/2009 | |
| JP | 2011-054933 A | 3/2011 | |
| JP | 2013-151035 A | 8/2013 | |
| JP | 2014-112595 A | 6/2014 | |
| JP | 2014138022 A * | 7/2014 | |
| JP | 2014138022 A | 7/2014 | |
| KR | 10-2005-0087361 A | 8/2005 | |
| KR | 100589796 B1 | 6/2006 | |
| KR | 1020090029585 A | 3/2009 | |
| KR | 101319785 B1 | 10/2013 | |
| KR | 10-2014-0014424 A | 2/2014 | |
| KR | 10-2015-0117054 A | 10/2015 | |
| KR | 20150141134 A * | 12/2015 | |
| KR | 10-2016-0003184 A | 1/2016 | |
| KR | 10-1841281 B | 3/2018 | |
| WO | 2018063851 A1 | 4/2018 | |

* cited by examiner

TRANSFER UNIT AND SUBSTRATE PROCESSING APPARATUS INCLUDING THE SAME

CROSS-REFERENCE TO RELATED APPLICATIONS

A claim for priority under 35 U.S.C. § 119 is made to Korean Patent Application No. 10-2018-0056275 filed on May 17, 2018, in the Korean Intellectual Property Office, the entire contents of which are hereby incorporated by reference.

BACKGROUND

Embodiments of the inventive concept described herein relate to a transfer unit and a substrate processing apparatus including the same.

In order to manufacture semiconductor devices, various processes such as photolithography, etching, ashing, ion implantation, thin-film deposition, cleaning, and the like are performed on a substrate to form desired patterns thereon. In etching process equipment used for the etching process among the aforementioned processes, parts used over a predetermined period of time have to be replaced in view of the amounts by which the parts are etched and a variation in the electric fields therein. Especially, a substrate processing apparatus mainly uses an electrostatic chuck to clamp a substrate. An edge ring provided around the electrostatic chuck to surround the substrate is directly exposed to chemical etching and physical etching and hence etched fast. Therefore, the edge ring has to be frequently replaced. In the related art, an edge ring is manually replaced by a worker while a chamber is at atmospheric pressure, or an edge ring is replaced by using a lift actuator around a chuck. However, these methods require a number of driving parts and therefore have problems in terms of generation of particles and a failure in control of the driving parts.

SUMMARY

Embodiments of the inventive concept provide an apparatus for efficiently replacing a ring provided in a substrate processing apparatus to surround a substrate.

Embodiments of the inventive concept provide an apparatus for transferring rings of various sizes that are provided in a substrate processing apparatus.

Embodiments of the inventive concept provide a substrate processing apparatus and a transfer unit for efficiently processing a substrate.

According to an exemplary embodiment, a transfer unit for transferring a member includes a hand and a fixing member that is provided in the hand and that fixes an object to be transferred, to a bottom side of the hand with an electrostatic force.

The fixing member may include a first electrode and a second electrode, and the transfer unit may further include a voltage applying device that applies voltages of different polarities to the first electrode and the second electrode.

A plurality of fixing members may be provided and may be combined with each other to surround the center of the hand.

The transfer unit may further include a first fixing body that fixes a first member of a first size and a second fixing body that fixes a second member of a second size that is different from the first size. The first fixing body and the second fixing body may each include the plurality of fixing members.

The voltage applying device may include a first power supply connected to the first fixing body, a second power supply connected to the second fixing body, and a controller that independently controls the first power supply and the second power supply.

The first fixing body may be located farther away from the center of the hand than the second fixing body when viewed from above.

The fixing members set forth above may further include a body protruding downward from the bottom side of the hand, and the first electrode and the second electrode may be provided in the body.

According to an exemplary embodiment, a transfer unit includes a hand, an upper fixing member that causes a first object to be supported on a top side of the hand by a first support method, and a lower fixing member that causes a second object to be supported on a bottom side of the hand by a second support method. The first support method and the second support method differ from each other.

The second support method may be a method of supporting the second object by an electrostatic force, and the first support method may be a method of restricting a lateral movement of the first object by using vacuum pressure or a stopper protruding from the top side of the hand.

The first object may be different from the second object in terms of shape, material, or area when viewed from above. The first object may be a circular substrate, and the second object may be a ring-shaped member having a larger diameter than the substrate.

According to an exemplary embodiment, an apparatus for processing a substrate includes a processing unit that performs predetermined processing on the substrate and a transfer unit that transfers the substrate into the processing unit. The processing unit includes a process chamber having a processing space inside, a support unit that supports the substrate in the process chamber, a gas supply unit that supplies a process gas into the processing space, and a plasma source that generates plasma from the process gas. The support unit includes a support on which the substrate is placed and an edge ring that surrounds the substrate placed on the support and that is detachable from the support. The transfer unit includes a hand having a top side on which the substrate is placed and a fixing member that is provided in the hand and that fixes the edge ring to a bottom side of the hand with an electrostatic force.

The edge ring may include an inner ring disposed to surround the substrate and an outer ring disposed to surround the inner ring.

The edge ring may be a focus ring.

The edge ring may be made of any one of silicon carbide (SiC), silicon (Si), or quartz.

According to an exemplary embodiment, a method for processing a substrate uses a substrate processing apparatus that performs predetermined processing on the substrate supported on a support unit in a process chamber having a processing space therein, in which the support unit includes an edge ring that surrounds the substrate.

The substrate processing method includes a substrate processing step of processing the substrate by generating plasma in the processing space and a maintenance step of maintaining the edge ring.

The substrate is supported on a top side of a hand when placed in or extracted from the processing space, and in the maintenance step, the edge ring is extracted from the processing space in a state of being supported on and fixed to a bottom side of the hand.

The edge ring may be supported on the bottom side of the hand by an electrostatic force.

The hand may include a first fixing body and a second fixing body, and the first fixing body may be located farther away from the center of the hand than the second fixing body. The edge ring may include an inner ring disposed to surround the substrate and an outer ring disposed to surround the inner ring.

The hand may fix the inner ring with an electrostatic force by the second fixing body when extracting the inner ring from the processing space, and the hand may fix the outer ring with an electrostatic force by the first fixing body when extracting the outer ring from the processing space.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
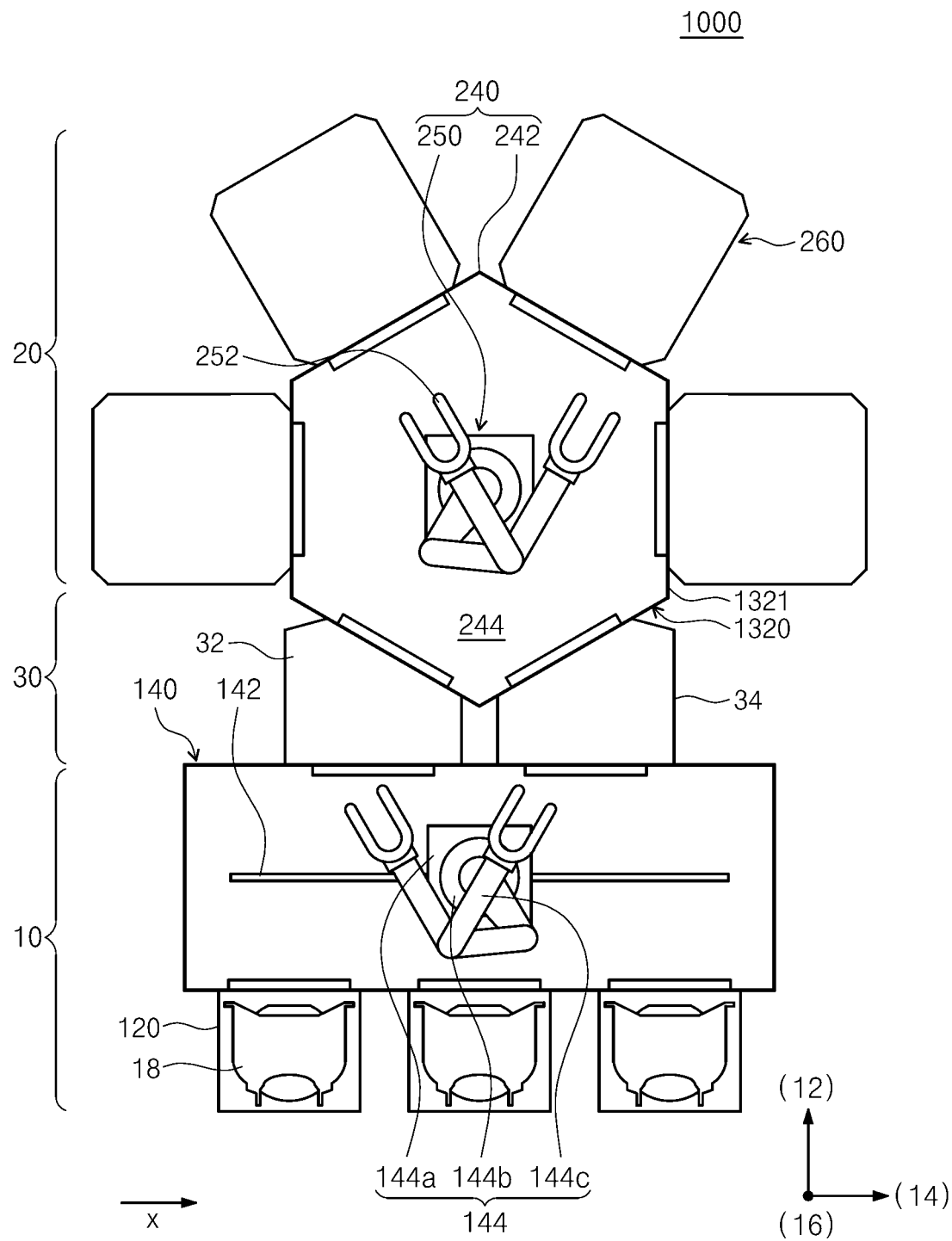
FIG. 1 is a plan view illustrating substrate processing equipment according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

In the entire specification, the terminology, component "~unit," refers to a software component or a hardware component such as an FPGA or an ASIC, and performs at least one function or operation. It should be, however, understood that the component "~unit" is not limited to a software or hardware component. The component "~unit" may be implemented in storage media that can be designated by addresses. The component "~unit" may also be configured to regenerate one or more processors.

For example, the component "~unit" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" may be separately performed by a plurality of components and components "~units" and may also be integrated with other additional components.

Hereinafter, a substrate processing apparatus for etching a substrate using plasma according to an embodiment of the inventive concept will be described. Without being limited thereto, however, the inventive concept is applicable to various apparatuses for processing a substrate using gas.

FIG. 1 is a plan view illustrating substrate processing equipment according to an embodiment of the inventive concept.

Referring to FIG. 1, the substrate processing equipment 1 has an index module 10, a load-lock module 30, and a processing module 20. The index module 10 has load ports 120 and a transfer frame 140. The load ports 120, the transfer frame 140, and the processing module 20 are sequentially arranged in a row. Hereinafter, the direction in which the load ports 120, the transfer frame 140, the load-lock module 30, and the processing module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

Carriers 18, each of which has a plurality of substrates W received therein, are placed on the load ports 120. The plurality of load ports 120 are arranged in a row along the second direction 14. FIG. 1 illustrates one example that the index module 10 has three load ports 120. However, the number of load ports 120 may be increased or decreased depending on conditions such as process efficiency and footprint of the processing module 20. Each of the carriers 18 has a plurality of slots (not illustrated) that are formed therein to support the edges of the substrates W. The plurality of slots are arranged in the third direction 16, and the substrates W are stacked one above another with a spacing gap therebetween in the carrier 18 along the third direction 16. A front opening unified pod (FOUP) may be used as the carrier 18.

The transfer frame 140 transfers the substrates W between the carriers 18 placed on the load ports 120 and the load-lock module 30. An index rail 142 and an index robot 144 are provided in the transfer frame 140. The index rail 142 is arranged such that the longitudinal direction thereof is parallel to the second direction 14. The index robot 144 is mounted on the index rail 142 and linearly moves along the index rail 142 in the second direction 14. The index robot 144 has a base 144*a*, a body 144*b*, and a plurality of index arms 144*c*. The base 144*a* is movable along the index rail 142. The body 144*b* is coupled to the base 144*a*. The body 144*b* is movable on the base 144*a* along the third direction 16. Furthermore, the body 144*b* is rotatable on the base 144*a*. The index arms 144*c* are coupled to the body 144*b* and are movable forward and backward relative to the body 144*b*. The plurality of index arms 144*c* may operate individually. The index arms 144*c* are stacked one above another with a spacing gap therebetween along the third direction 16. Some of the index arms 144*c* may be used to transfer substrates W from the load-lock module 30 to the carriers 18, and the other index arms 144*c* may be used to transfer substrates W from the carriers 18 to the load-lock module 30. Accordingly, particles generated from substrates W to be processed may be prevented from adhering to processed substrates W in the process in which the index robot 144 transfers the substrates W between the carriers 18 and the load-lock module 30.

The load-lock module 30 is disposed between the transfer frame 140 and a transfer unit 240. The load-lock module 30 replaces the atmospheric atmosphere of the index module 10 with the vacuum atmosphere of the processing module 20 for a substrate W to be transferred to the processing module 20, or replaces the vacuum atmosphere of the processing module 20 with the atmospheric atmosphere of the index module 10 for a substrate W to be transferred to the index module 10. The load-lock module 30 provides a space in which the substrates W stay before transferred between the transfer unit 240 and the transfer frame 140. The load-lock module 30 includes a load-lock chamber 32 and an unload-lock chamber 34.

The load-lock chamber 32 provides a space in which a substrate W to be transferred from the index module 10 to the processing module 20 temporarily stays. The load-lock chamber 32 maintains an atmospheric atmosphere in a standby state and is closed to the processing module 20, but open to the index module 10. When a substrate W is placed in the load-lock chamber 32, the inner space of the load-lock chamber 32 is sealed from the index module 10 and the processing module 20. Thereafter, the atmospheric atmosphere in the load-lock chamber 32 is replaced with a vacuum atmosphere, and the load-lock chamber 32 is open to the processing module 20 in the state of being closed to the index module 10.

The unload-lock chamber 34 provides a space in which a substrate W to be transferred from the processing module 20 to the index module 10 temporarily stays. The unload-lock chamber 34 maintains a vacuum atmosphere in a standby state and is closed to the index module 10, but open to the processing module 20. When a substrate W is placed in the unload-lock chamber 34, the inner space of the unload-lock chamber 34 is sealed from the index module 10 and the processing module 20. Thereafter, the vacuum atmosphere in the unload-lock chamber 34 is replaced with an atmospheric atmosphere, and the unload-lock chamber 34 is open to the index module 10 in the state of being closed to the processing module 20.

The processing module 20 includes the transfer unit 240 and a plurality of process chambers 260.

The transfer unit 240 transfers a substrate W between the load-lock chamber 32, the unload-lock chamber 34, and the plurality of process chambers 260. The transfer unit 240 includes a transfer chamber 242 and a transfer robot 250. The transfer chamber 242 may have a hexagonal shape. Alternatively, the transfer chamber 242 may have a rectangular or pentagonal shape. The load-lock chamber 32, the unload-lock chamber 34, and the plurality of process chambers 260 are located around the transfer chamber 242. A transfer space 244 for transferring the substrate W is provided in the transfer chamber 242.

The transfer robot 250 transfers the substrate W in the transfer space 244. The transfer robot 250 may be located in the middle of the transfer chamber 240. The transfer robot 250 may have a plurality of hands 252 that are movable in the horizontal and vertical directions and movable forward and backward or rotatable on the horizontal plane. Each of the hands 252 is operable individually, and the substrate W may be horizontally placed on the hand 252.

A processing unit 1000 provided in each of the process chambers 260 will be described below. The processing unit 1000 is described as an apparatus for etching a substrate W. Without being limited thereto, however, the processing unit 1000 is applicable to various processing units using gas.

Figure 2:
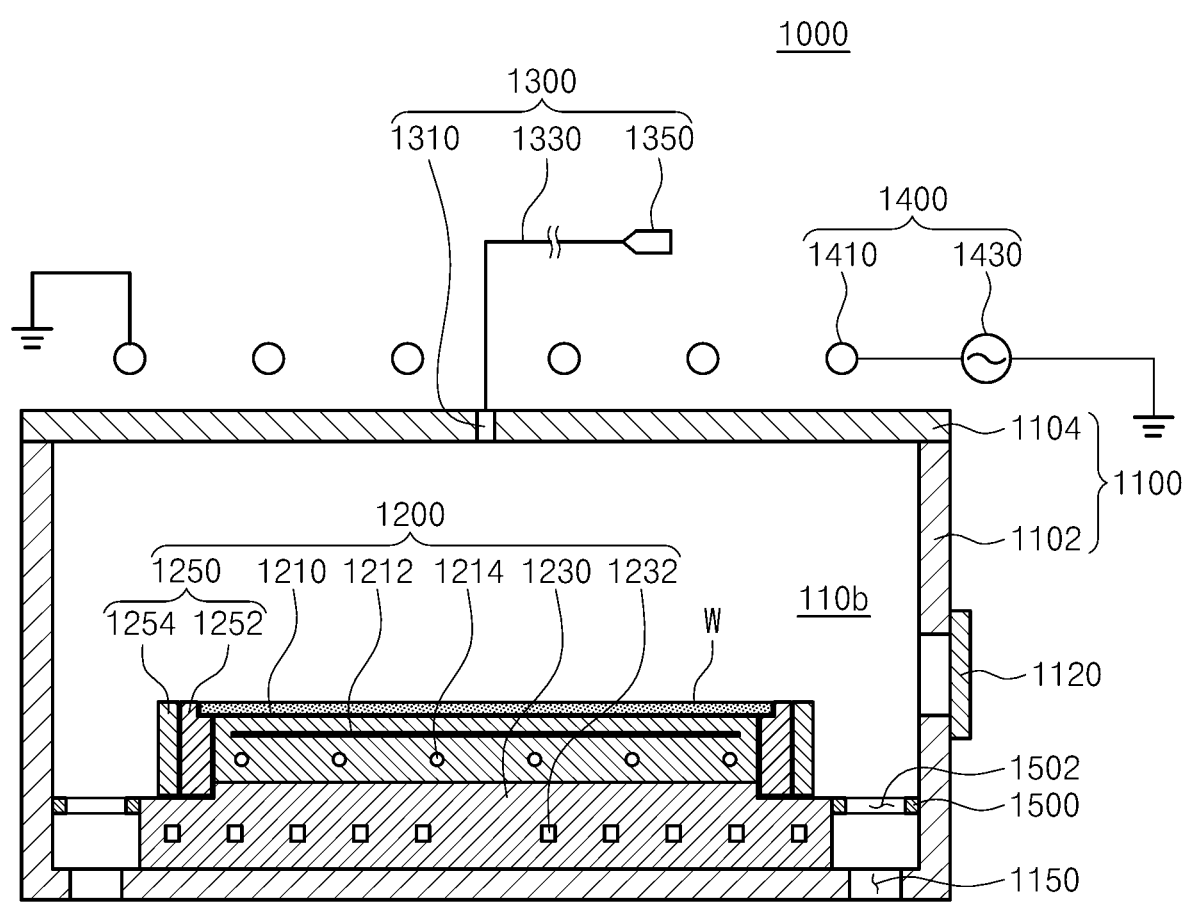
FIG. 2 is a sectional view illustrating a processing unit of FIG. 1.

FIG. 2 is a sectional view illustrating the processing unit of FIG. 1. Referring to FIG. 2, the processing unit 1000 includes a chamber 1100, a substrate support unit 1200, a gas supply unit 1300, a plasma source 1400, and an exhaust baffle 1500.

The chamber 1100 has a processing space 1106 in which a substrate W is processed. The chamber 1100 has a cylindrical shape. The chamber 1100 is made of metal. For example, the chamber 1100 may be made of aluminum. The chamber 1100 has an opening formed in one sidewall thereof. The opening functions as an entrance through which the substrate W is extracted from or placed in the chamber 1100. The opening is closed or opened by a door 1120. The chamber 1100 has a lower hole 1150 formed in the bottom thereof. A pressure-reducing member (not illustrated) is connected to the lower hole 1150. The processing space 1106 of the chamber 1100 may be exhausted by the pressure-reducing member, and a pressure-reduced atmosphere may be formed in the processing space 1106.

The substrate support unit 1200 supports the substrate W in the processing space 1106. The substrate support unit 1200 may be an electrostatic chuck 1200 that supports the substrate W using an electrostatic force. Alternatively, the substrate support unit 1200 may support the substrate W by various methods, such as mechanical clamping.

The electrostatic chuck 1200 includes a dielectric plate 1210, a base 1230, and an edge ring 1250. The dielectric plate 1210 includes a dielectric material. The substrate W is directly placed on the top side of the dielectric plate 1210. The dielectric plate 1210 has a circular plate shape. The dielectric plate 1210 may have a smaller radius than the substrate W. The dielectric plate 1210 has an inner electrode 1212 installed therein. The inner electrode 1212 is connected to a power supply (not illustrated) and receives electric power from the power supply (not illustrated). The inner electrode 1212 applies an electrostatic force to the substrate W by using the applied electric power (not illustrated) to clamp the substrate W to the dielectric plate 1210. The dielectric plate 1210 has a heater 1214 installed therein to heat the substrate W. The heater 1214 may be located below the inner electrode 1212. The heater 1214 may have a spiral coil shape.

The base 1230 supports the dielectric plate 1210. The base 1230 is located below the dielectric plate 1210 and is fixedly coupled to the dielectric plate 1210. The base 1230 has a stepped upper surface, the central region of which is in a higher position than the edge region. The central region of the upper surface of the base 1230 has an area corresponding to the bottom side of the dielectric plate 1210. The base 1230 has a cooling line 1232 formed therein. The cooling line 232 functions as a passage through a cooling fluid circulates. The cooling line 1232 may be formed in a spiral shape in the base 1230. The base 1230 is connected to an RF power supply 1234 located outside. The RF power supply 1234 applies electric power to the base 1230. The electric power applied to the base 1230 guides plasma generated in the chamber 1100 toward the base 1230. The base 1230 may be made of metal.

The edge ring 1250 concentrates the plasma onto the substrate W. The edge ring 1250 includes an inner ring 1252 and an outer ring 1254. The inner ring 1252 has an annular ring shape surrounding the dielectric plate 1210. The inner ring 1252 is located at the periphery of the base 1230. A portion of the inner ring 1252 is flush with the top side of the dielectric plate 1210. An inner peripheral portion of an upper surface of the inner ring 1252 supports the edge region of the back side of the substrate W. The outer ring 1254 has an annular ring shape surrounding the inner ring 1252. The outer ring 1254 is located adjacent to the inner ring 1252 on the edge region of the base 1230. The outer ring 1254 may have an upper end higher than the inner peripheral portion of the inner ring 1252.

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall of the chamber 1100. The gas intake port 1310 is located to face the substrate support unit 1200. According to an embodiment, the gas intake port 1310 may be installed in the center of the upper wall of the chamber 1100. A valve may be installed in the gas supply line 1330 to open or close the inner passage or to regulate the amount of gas flowing through the inner passage. For example, the process gas may be an etching gas.

The plasma source 1400 excites the process gas in the chamber 1100 into plasma. An inductively coupled plasma (ICP) source may be used as the plasma source 1400. The plasma source 1400 includes an antenna 1410 and an external power supply 1430. The antenna 1410 is disposed above the chamber 1100. The antenna 1410 has a spiral shape wound a plurality of times and is connected to the external power supply 1430. The antenna 1410 receives electric power from the external power supply 1430. The antenna 1410 to which the electric power is applied forms a discharge space in the inner space of the chamber 1100. The process gas staying in the discharge space may be excited into plasma.

The exhaust baffle 1500 uniformly releases the plasma by region in the processing space 1106. The exhaust baffle 1500 has an annular ring shape. The exhaust baffle 1500 is located between an inner wall of the chamber 1100 and the substrate support unit 1200 in the processing space 1106. The exhaust baffle 1500 has a plurality of exhaust holes 1502 formed therein. The exhaust holes 1502 are oriented in the vertical direction. The exhaust holes 1502 extend from the top of the exhaust baffle 1500 to the bottom thereof. The exhaust holes 1502 are spaced apart from each other along the circumferential direction of the exhaust baffle 1500. Each of the exhaust holes 1502 has a slit shape, the longitudinal direction of which is oriented in the radial direction.

Next, the transfer unit 240 will be described in more detail.

Figure 3:
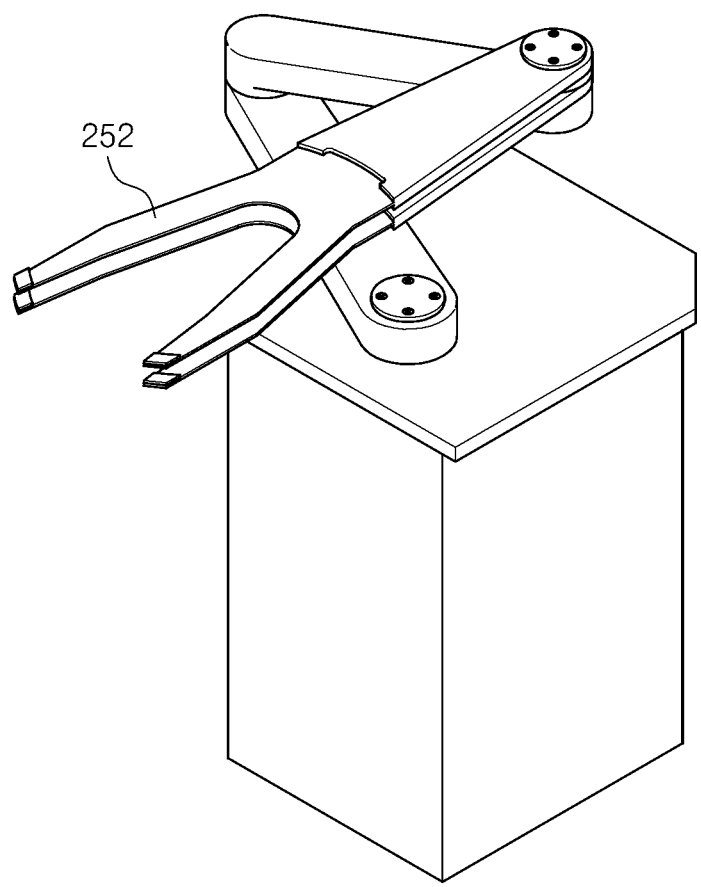
FIG. 3 is a view illustrating a transfer unit of FIG. 1.

FIG. 3 is a schematic view illustrating the transfer unit of FIG. 1. The transfer unit 240 may include the hands 252 on each of which a substrate W is placed and fixing members 253 provided in a lower portion of each hand 252. The fixing members 253 may fix an object to be transferred, to the bottom side of the hand 252 with an electrostatic force.

Figure 6:
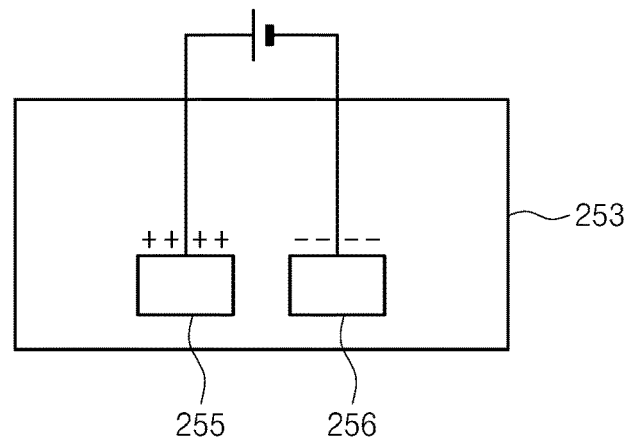
FIG. 6 is a view illustrating a structure of the fixing member included in the transfer unit of FIG. 5.
Figure 7:
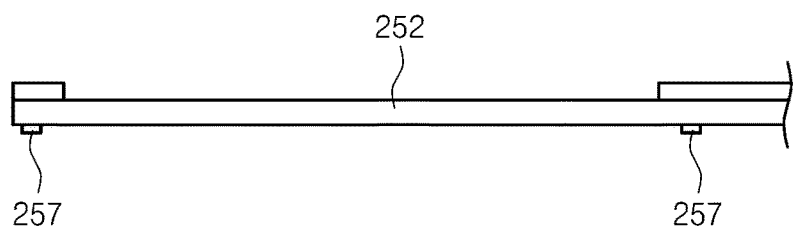
FIG. 7 is a side view illustrating one embodiment of the transfer unit of FIG. 5.
Figure 8:
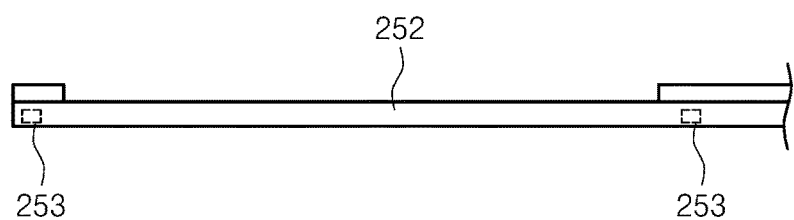
FIG. 8 is a side view illustrating another embodiment of the transfer unit of FIG. 5.

FIG. 6 is a view illustrating the fixing member according to the inventive concept. FIG. 7 is a side view illustrating the transfer unit including the fixing members and the hand. FIG. 8 is a side view illustrating a transfer unit according to another embodiment.

The transfer unit 240 according to the inventive concept may include the fixing members 253, each of which may include a first electrode 255 and a second electrode 256. The first electrode 255 and the second electrode 256 are arranged side by side with a predetermined spacing gap therebetween, and voltages of different polarities are applied to the first and second electrodes 255 and 256. A positive voltage and a negative voltage may be applied to the first electrode 255 and the second electrode 256, respectively, or vice versa. The transfer unit 240 may include a voltage applying device 270 that applies voltages of different polarities to the first and second electrodes 255 and 256. The voltage applying device 270 may change the polarities and levels of voltages applied to the first and second electrodes 255 and 256. The voltage applying device 270 may include a power supply. In the connection relationship between the voltage applying device 270 and the plurality of fixing members 253, power supplies may be connected to the fixing members 253, respectively, or one power supply may be connected to the plurality of fixing members 253 to apply a voltage at one time. When voltages of different polarities are applied to the first and second electrodes 255 and 256, an object to be transferred that is made of silicon carbide (SiC), silicon (Si), or quartz and that is in contact with the fixing member 253 is charged with opposite charges. Due to this, the fixing member 253 and the object to be transferred may be fixed to each other by an electrostatic force between the charges of opposite polarities.

According to an embodiment, as illustrated in FIG. 7, each of the fixing members 253 included in the hand 252 of the transfer unit 240 may include a body 257 protruding downward from the bottom side of the hand 252, and the first electrode 255 and the second electrode 256 may be included in the body 257. In another embodiment of the inventive concept, as illustrated in FIG. 8, the fixing members 253 may be included in the hand 252 without protruding. However, the fixing members 253 having a protruding structure may be preferred in terms of stability because the fixing members 253 and the object to be transferred are brought into contact with and fixed to each other by using the principle of an electrostatic chuck.

Figure 4:
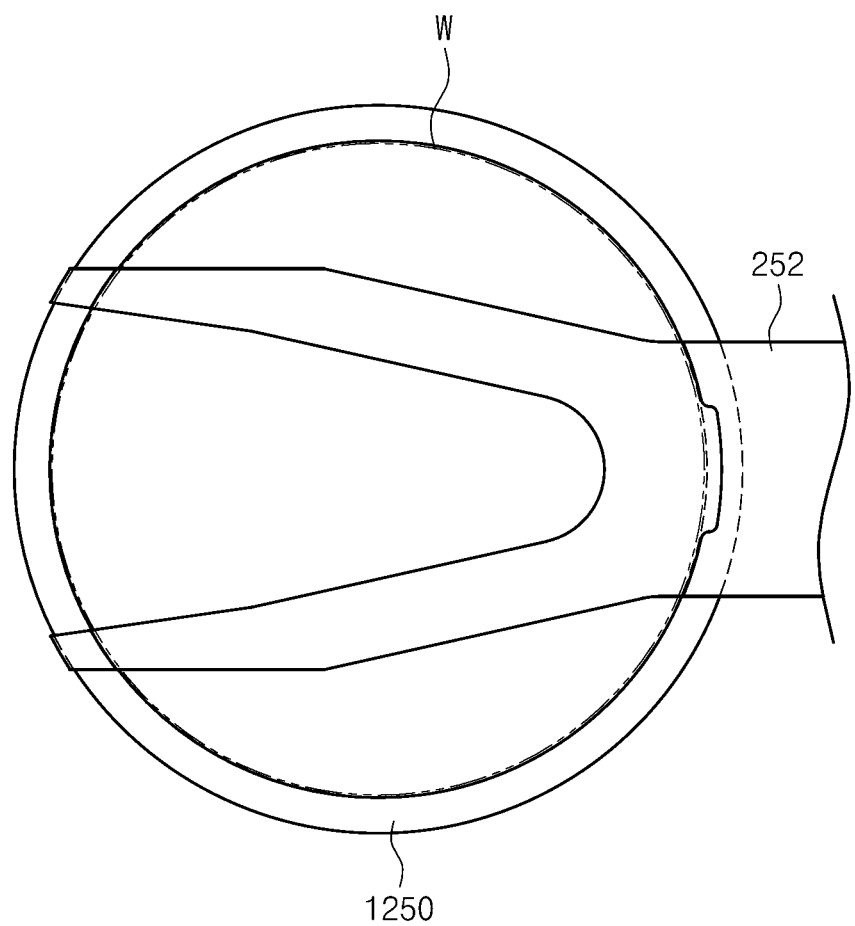
FIG. 4 is a view illustrating a size by which a substrate and a ring correspond to the transfer unit of FIG. 3.

FIG. 4 is a top view illustrating a position where the hand of the transfer unit, a substrate, and a ring correspond to one another of the inventive concept.

A substrate W is sequentially processed in the processing unit 1000. The processed substrate W is transferred out of the processing unit 1000 by the hand 252 of the transfer unit 240, and even when transferred into the processing unit 1000 for substrate processing, the substrate W is transferred by the hand 252 of the transfer unit 240. The substrate W is transferred in the state of being placed on the top side of the hand 252 of the transfer unit 240.

When the substrate W is processed in the processing unit 1000 as described above, one or more edge rings 1250 are provided around the substrate W. The edge rings 1250 may be focus rings or insulation rings. According to an embodiment, each of the edge rings 1250 may include the inner ring 1252 and the outer ring 1254. In this case, both the inner ring 1252 and the outer ring 1254 may be focus rings made of the same material. Alternatively, the inner ring 1252 may be a focus ring, and the outer ring 1254 may be an insulation ring. The inner ring 1252 may be disposed to surround the substrate W, and the outer ring 1254 may be disposed to surround the inner ring 1252. However, the edge ring 1250 may be implemented with a single ring.

Figure 5:
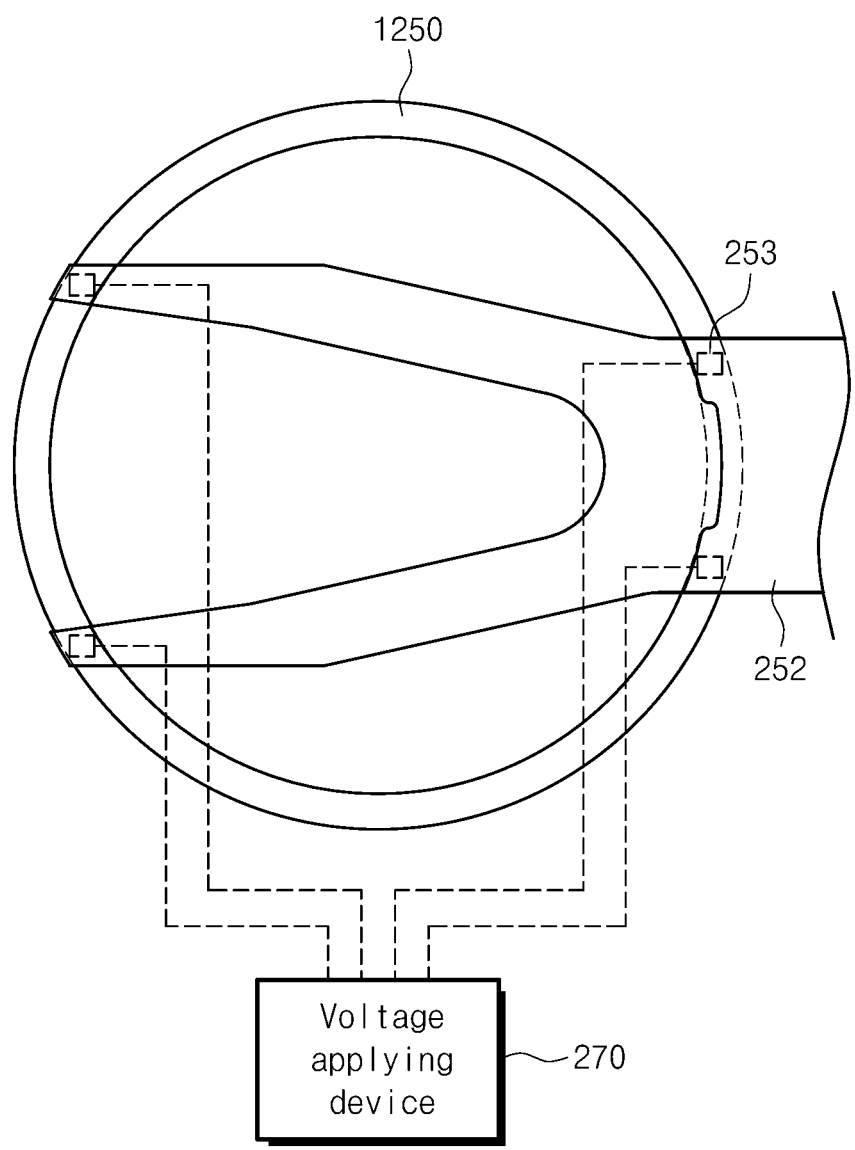
FIG. 5 is a view illustrating an arrangement structure of fixing members when the transfer unit of FIG. 4 fixes a ring to the bottom side thereof.

FIG. 5 is a view illustrating the transfer unit according to an embodiment of the inventive concept. The edge ring 1250 of FIG. 5 is implemented with a single ring. To transfer the edge ring 1250, the transfer unit 240 may include the fixing members 253 in the hand 252 in a position corresponding to the edge ring 1250. In this embodiment, four fixing members 253 are included in the edge portion of the hand 252. However, this is merely illustrative, and the number of fixing members 253 may be variously changed. The plurality of fixing members 253 may be combined with each other and may be arranged to surround the center of the hand 252. The voltage applying device 270 may apply voltages to the plurality of fixing members 253. Voltages of different polarities are applied to the first and second electrodes 255 and 256 included in each fixing member 253, and contact portions of the object to be transferred, which are brought into contact with the fixing members 253 located in corners of the hand 252, are charged with electrostatic charges so that an electrostatic force is generated. Accordingly, the object to be transferred and the fixing members 253 are fixed to each other, and the electrostatic force evenly exerted on the object to be transferred enables the object to be safely transferred outside the processing unit 1000.

Figure 9:
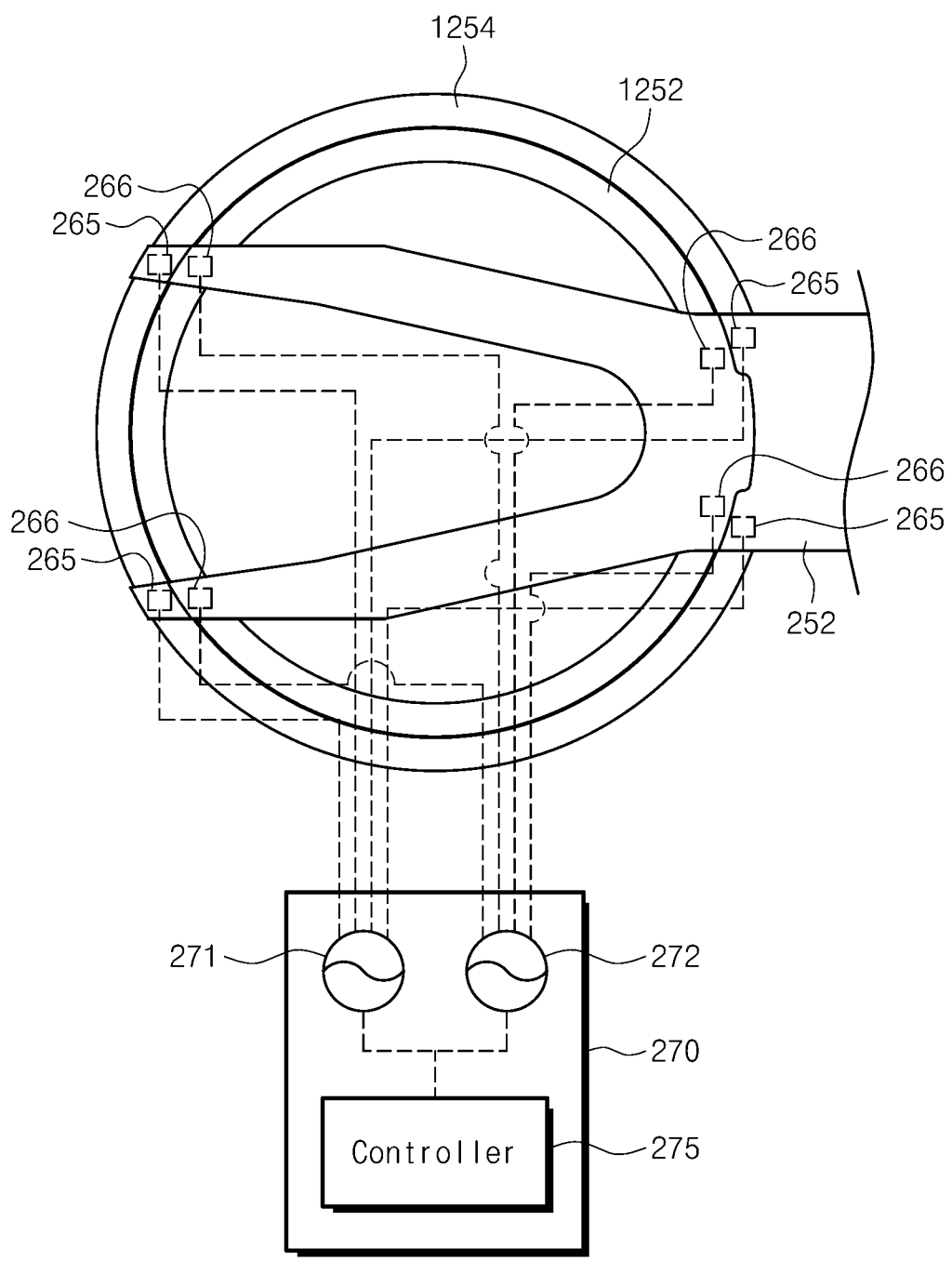
FIG. 9 is a view illustrating an arrangement structure of fixing members according to another embodiment of the inventive concept.

FIG. 9 is a top view illustrating an arrangement of fixing members of a transfer unit according to another embodiment of the inventive concept.

In the other embodiment of the inventive concept, the transfer unit 240 transfers a substrate by using the top side thereof in the same way and transfers a ring by using the bottom side thereof. In a substrate processing apparatus, the inner ring 1252 and the outer ring 1254 are used together to fix the substrate. The outer ring 1254 is disposed to surround the inner ring 1252.

The transfer unit 240 may include first fixing bodies 265 for fixing a first member of a first size and second fixing bodies for fixing a second member of a second size that is different from the first size. The first fixing bodies 265 and the second fixing bodies 266 may each include a plurality of fixing members 253. The transfer unit 240 may include the voltage applying device 270. According to this embodiment, the voltage applying device 270 includes a first power supply 271, a second power supply 272, and a controller 275. The first power supply 271 is connected with the first fixing bodies 265. The second power supply 272 is connected with the second fixing bodies 266. The controller 275 may independently control the first power supply 271 connected to the first fixing bodies 265 and the second power supply 272 connected to the second fixing bodies 266. The first member may be the outer ring 1254, and the second member may be the inner ring 1252. When viewed from above, the first fixing bodies 265 disposed in positions corresponding to the first member may be located farther away from the center of the hand 252 than the second fixing bodies 266 disposed in positions corresponding to the second member. In a normal substrate processing apparatus, an edge ring including an inner ring and an outer ring is usually used to fix a substrate. However, the use frequencies of the inner and outer rings differ from each other, and therefore the replacement cycles thereof also differ from each other. In this embodiment, the controller 275 identifies the replacement cycles of the inner ring 1252 and the outer ring 1254 and performs control to apply a voltage to the second power supply 272 connected with the second fixing bodies 266 corresponding to the inner ring 1252 when the time to replace the inner ring 1252 arrives. In this case, only the inner ring 1252 rather than the outer ring 1254 may be easily removed. On the same principle, the controller 275 performs control to apply a voltage to the first power supply 271 connected with the first fixing bodies 265 corresponding to the outer ring 1254 when the time to replace the outer ring 1254 arrives. Consequently, only the outer ring 1254 rather than the inner ring 1252 may be easily removed. That is, a desired ring may be selectively removed and replaced by applying a voltage to a fixing body in a position corresponding to the desired ring.

Although not illustrated, in the case where the replacement cycles of the inner ring 1252 and the outer ring 1254 overlap each other, the inner ring 1252 and the outer ring 1254 may be simultaneously replaced by applying voltages to both the first power supply 271 and the second power supply 272.

In the above embodiments and drawings, the four fixing members or the eight fixing members are fixedly installed on the bottom side of the hand 252. However, one or more fixing members 253 may be variously disposed on the bottom side of the hand 252 of the transfer unit 240. No special limitation applies to the positions and number of fixing members as long as the fixing members can apply a force sufficient to raise an object to be transferred. In this embodiment, in view of the shape of the hand 252, the distal end of which is divided into two separate parts, the hand 252 including the eight fixing bodies 265 and 266 in the corners thereof to raise the circular ring is disclosed as an example. However, the hand 252 of the inventive concept may have various shapes. The hand 252 may have a circular plate shape rather than the shape in which the distal end is divided into two separate parts. In this case, it is apparent to those skilled in the art that the fixing members may be radially separated from each other by an angle of 120 degrees or 180 degrees.

The above-described transfer units 240 all have a feature of fixing the object to be transferred, to the bottom side of the hand 252 by using the electrostatic force. The transfer unit 240 according to an embodiment of the inventive concept includes the hand 252 and may include an upper fixing member and a lower fixing member. The upper fixing member may cause a first object to be supported on the top side of the hand 252 by a first support method, and the lower fixing member may cause a second object to be supported on the bottom side of the hand 252 by a second support method.

The first support method and the second support method may differ from each other. The first object may be a circular substrate, and the second object may be a ring-shaped member having a larger diameter than the substrate. The second object may be a ring surrounding the substrate. The substrate may be clamped to the top side of the hand 252 by vacuum pressure. In this case, the hand 252 may have vents formed on the top side thereof to clamp the first object, and the first object may be clamped to the top side of the hand 252 when pressure is reduced by a vacuum pump connected to an intake hole. Alternatively, the hand 252 may include a stopper on the top side thereof to prevent a movement of the substrate, and the substrate may be supported or fixed by the stopper. The second object may be fixed by using an electrostatic force as described above. That is, due to the structural nature of the chamber unit, the substrate is transferred and replaced by using the top side of the hand 252, and the ring surrounding the substrate is transferred and replaced by using the bottom side of the hand 252. Hence, the substrate that is the first object and the ring that is the second object may differ from each other in terms of shape, material, and area. However, the second object is not limited to the ring and may be an object that has a material similar to that of the substrate, but has a different structure than the substrate.

FIGS. 10 to 14 are views sequentially illustrating a method of removing a ring by using the transfer unit according to an embodiment of the inventive concept.

Figure 10:
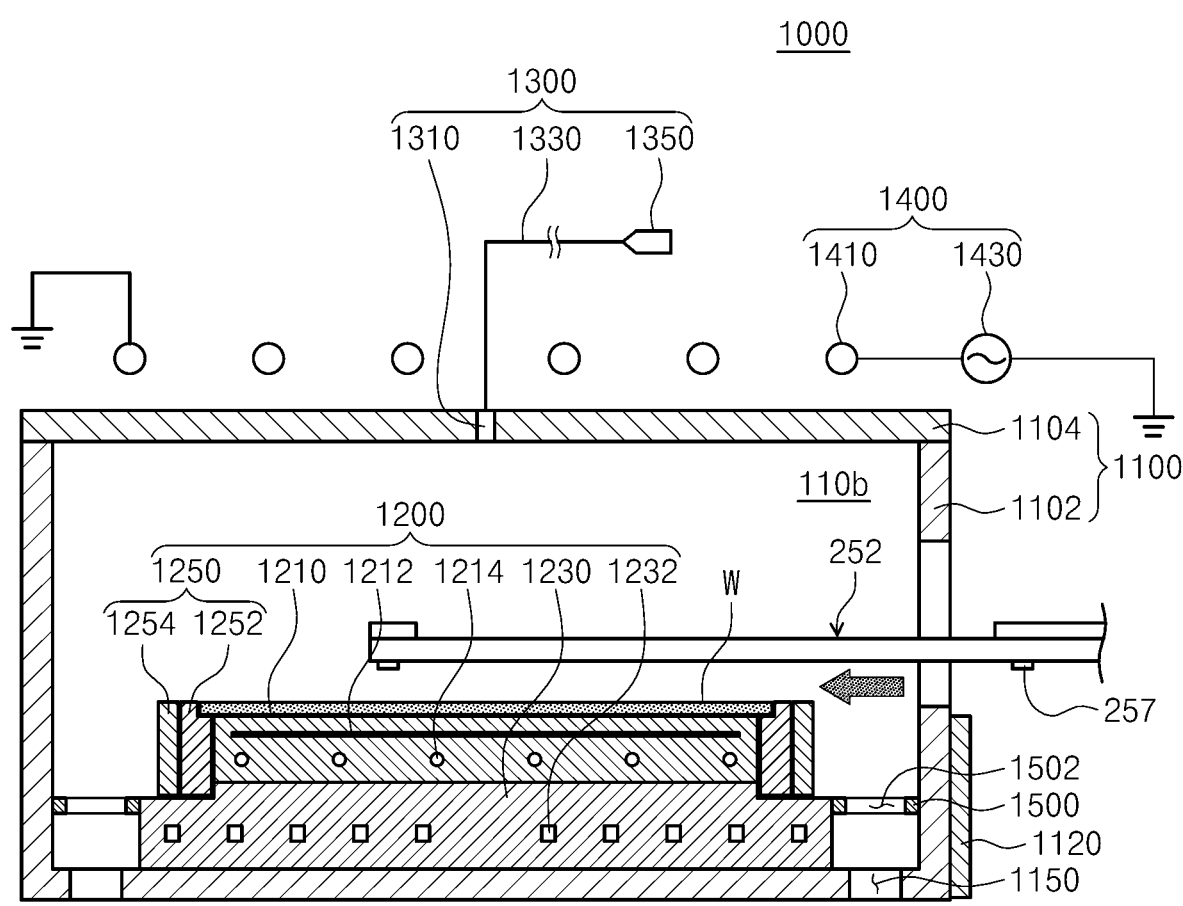
FIGS. 10 to 14 are views sequentially illustrating a method of transferring a ring by using the transfer unit according to an embodiment of the inventive concept.
Figure 11:
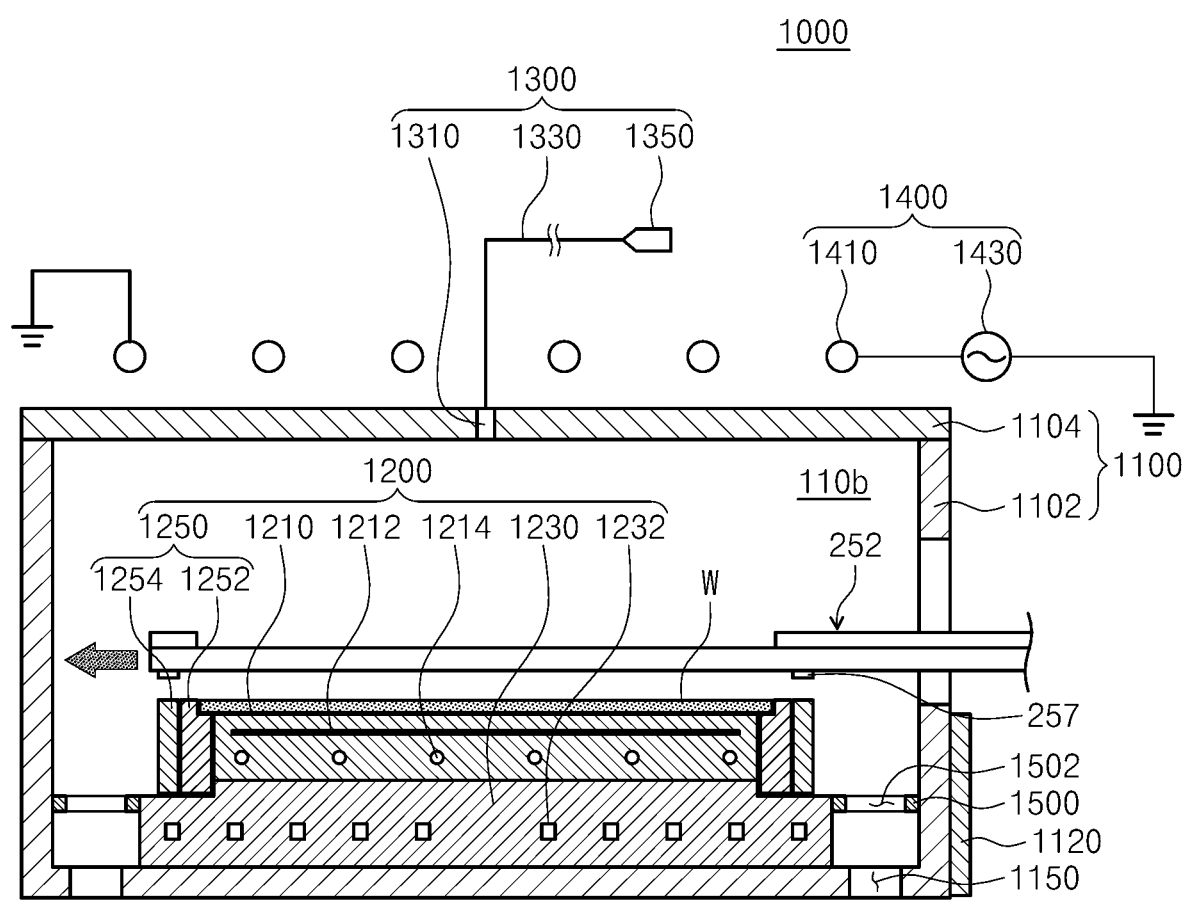
Figure 12:
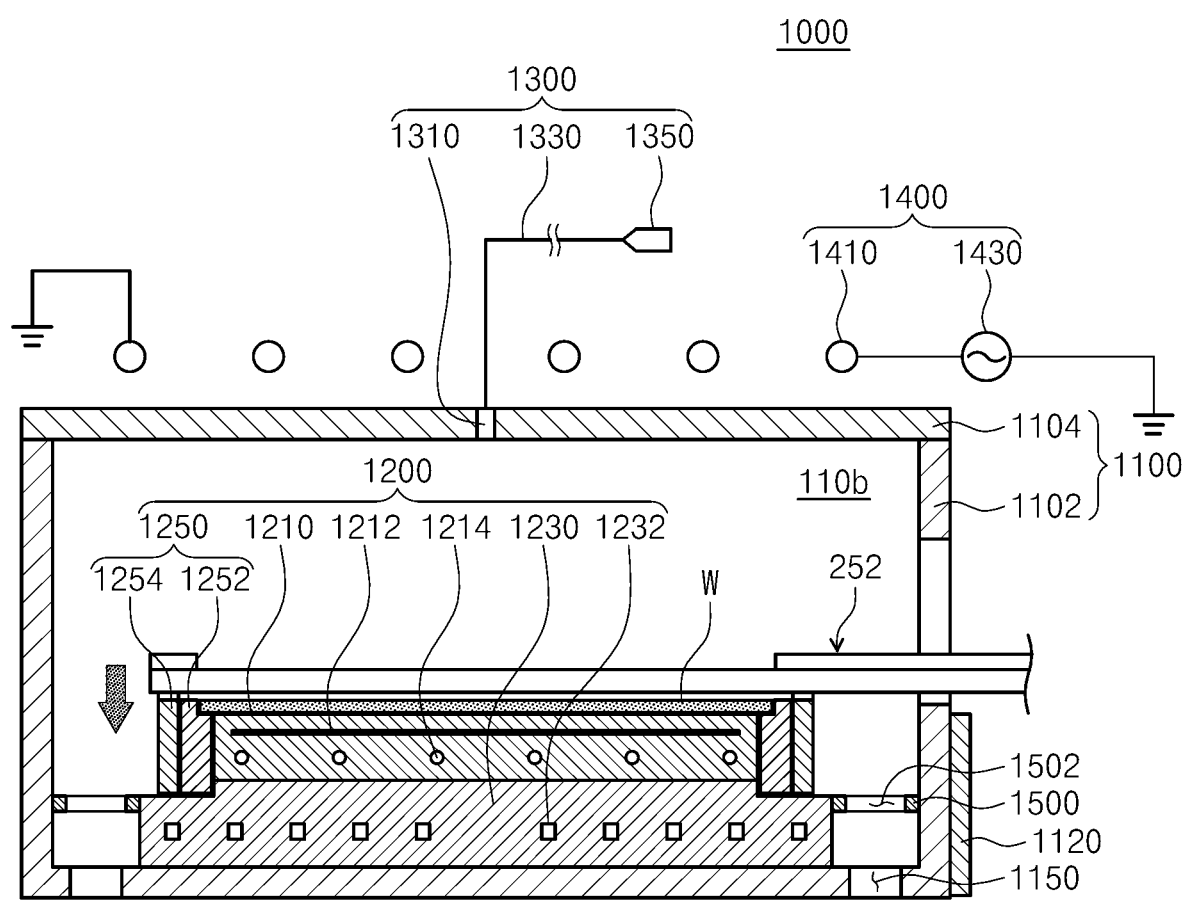

In FIG. 10, the transfer unit 240 enters the processing unit 1000. At this time, the transfer unit 240 does not transfer a substrate. In FIG. 11, the hand 252 of the transfer unit 240, which enters the processing unit 1000, is disposed in a horizontal position corresponding to the position where the hand 252 transfers a substrate W. In FIG. 12, the hand 252 of the transfer unit 240 vertically moves toward an object to be transferred, after disposed in the horizontal position where the hand 252 transfers the substrate W. The hand 252 of the transfer unit 240 is provided in the position corresponding to the object to be transferred, and the transfer unit 240 vertically moves to the distance by which an electrostatic force has an influence on the object to be transferred. At this time, the bottom side of the hand 252 and the object to be transferred, or the bodies 257 protruding from the bottom side of the hand 252 and the object to be transferred, may make contact with each other.

Figure 13:
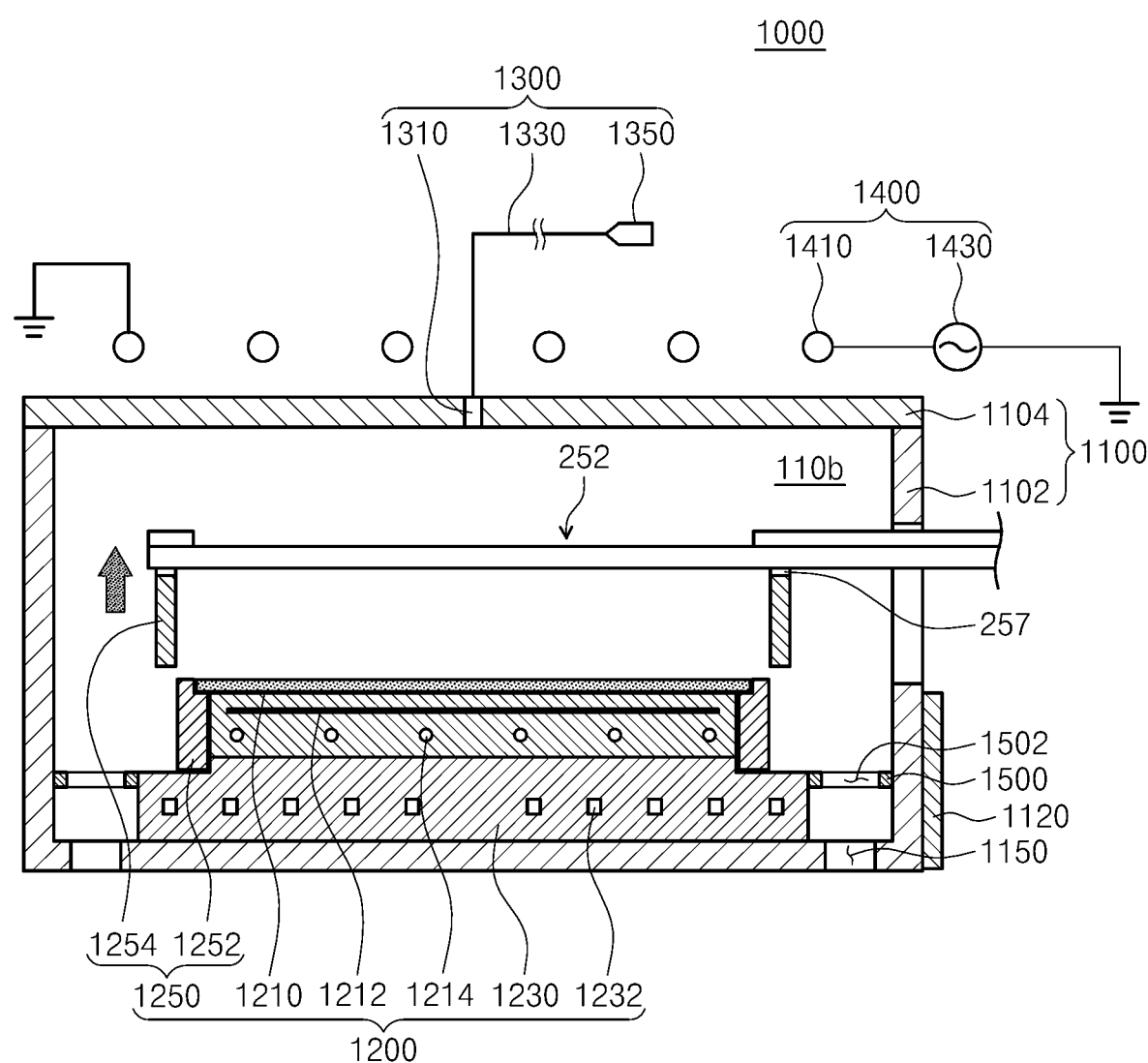
Figure 14:
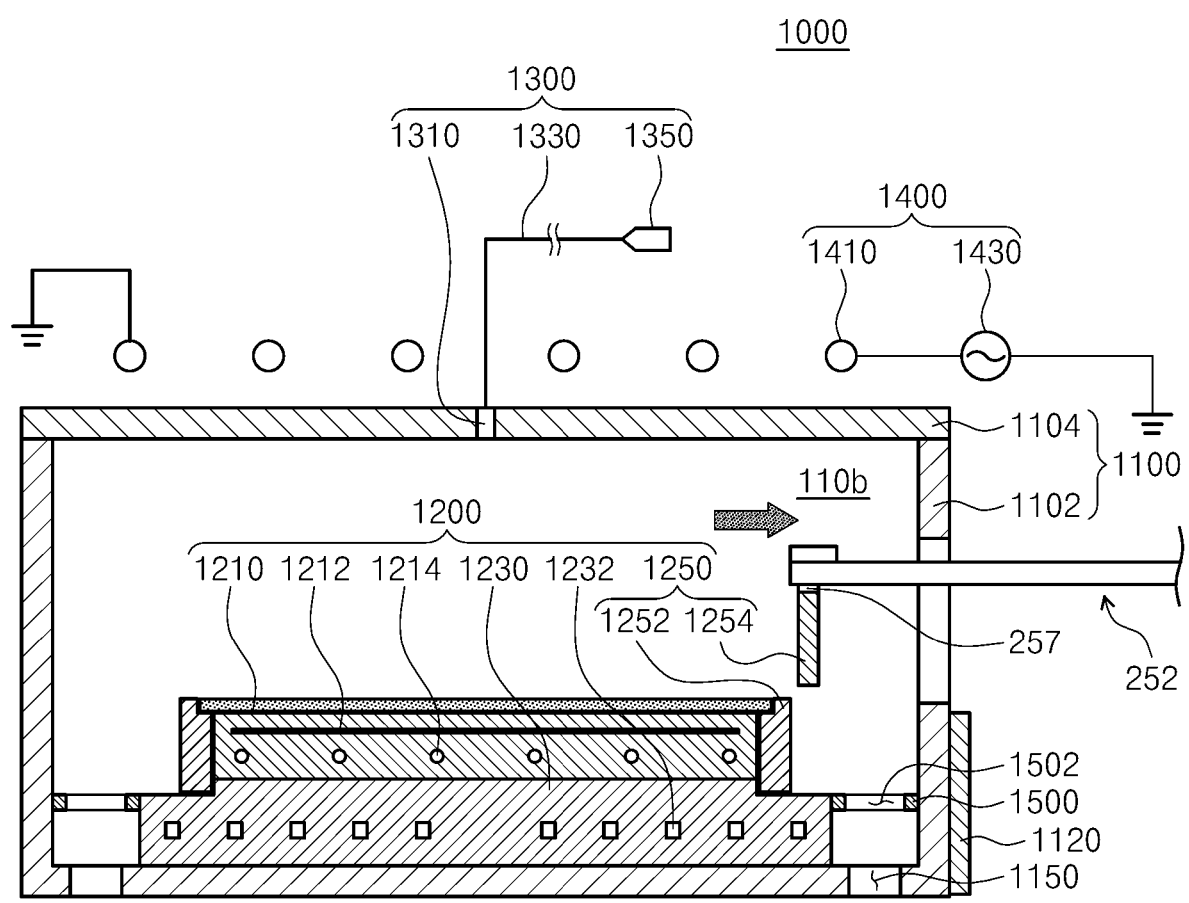

In FIG. 13, the power supply connected to the electrodes included in the fixing members 253 in the hand 252 applies voltages to the electrodes. Due to this, an electrostatic force is generated, and charges in the ring, which is the object to be transferred, are rearranged by the applied electrostatic force. That is, the hand 252 may clamp the ring by using the electrostatic force. When the outer ring 1254 is fixed to the bottom side of the hand 252 by the electrostatic force, the transfer unit 240 moves to a vertical position where the transfer unit 240 can transfer the outer ring 1254 outside the processing unit 1000. In FIG. 14, the transfer unit 240 horizontally moves to transfer the ring outside the processing unit 1000.

Although not illustrated, the transfer unit 240 may detach the ring from the hand 252 by using a de-chucking method after transferring the ring outside the processing unit 1000.

Although FIGS. 10 to 14 illustrate one example that the outer ring 1254 is removed, the inner ring 1252 may also be removed in the same way. In the processes of FIGS. 12 and 13, to remove the outer ring 1254, the controller 275 of the transfer unit 240 applies a voltage to the first power supply 271, which is connected with the first fixing bodies 265, to fix and replace the outer ring 1254. To remove the inner ring 1252, the controller 275 of the transfer unit 240 may apply a voltage to the second power supply 272 connected with the second fixing bodies 266. The voltage may be applied when the hand 252 is vertically disposed in the position corresponding to the substrate W, and the inner ring 1252 may be fixed to the fixing members by an electrostatic force.

Hereinafter, a method of processing a substrate by using the transfer unit and the substrate processing apparatus according to the inventive concept will be described.

A substrate is processed using plasma in the processing unit 1000 of the inventive concept. The substrate to be processed is transferred into the processing unit 1000 by the transfer unit 240. The substrate placed on the top side of the hand 252 may be clamped by vacuum pressure or by a support method using a stopper. The transfer unit 240 moves outside the processing unit 1000 after transferring the substrate into the processing unit 1000. When the substrate is completely processed, whether the edge ring 1250 is etched or not is determined. In the case where the outer ring 1254 or the inner ring 1252 of the edge ring 1250 is etched, an object to be replaced is selected. A voltage is applied to the first fixing bodies 265 relevant to the outer ring 1254 or the second fixing bodies 266 relevant to the inner ring 1252 that correspond to the ring to be replaced. An electrostatic force is generated by the applied voltage, and therefore the first fixing bodies 265 and the outer ring 1254, or the second fixing bodies 266 and the inner ring 1252, are fixed to each other. The fixed ring is transferred outside the processing unit 1000, and thus substrate processing may be efficiently performed.

According to the embodiments of the inventive concept, the edge ring disposed in the processing unit may be replaced by using the transfer unit of the substrate processing apparatus.

Furthermore, edge rings of various sizes that are disposed in the processing unit may be replaced by using the transfer unit.

Moreover, the edge ring in the processing unit may be replaced by using a simpler structure.

In addition, the inventive concept may provide the substrate processing apparatus and the transfer unit that are capable of efficiently processing a substrate.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A transfer unit for transferring a member, the transfer unit comprising:

a hand; and a fixing member provided in the hand, the fixing member being configured to fix an object to be transferred, to a bottom side of the hand with an electrostatic force, wherein the fixing member includes a first electrode and a second electrode, wherein the transfer unit further comprises a voltage applying device configured to apply voltages of different polarities to the first electrode and the second electrode, wherein the fixing member further includes a body protruding downward from the bottom side of the hand, wherein the first electrode and the second electrode are provided in the body, a support on which a substrate is placed; and an edge ring configured to surround the substrate placed on the support, wherein the edge ring includes:
an inner ring disposed to surround the substrate; and
an outer ring disposed to surround the inner ring,
wherein the transfer unit further includes:
a first fixing body configured to fix the outer ring; and
a second fixing body configured to fix the inner ring, and
wherein the first fixing body and the second fixing body each include the plurality of fixing members.

2. The transfer unit of claim 1, wherein the transfer unit further comprises:
a first fixing body configured to fix a first member of a first size; and
a second fixing body configured to fix a second member of a second size that is different from the first size, and
wherein the first fixing body and the second fixing body each include the plurality of fixing members.

3. The transfer unit of claim 2, wherein the voltage applying device includes:
a first power supply connected to the first fixing body;
a second power supply connected to the second fixing body; and
a controller configured to independently control the first power supply and the second power supply.

4. The transfer unit of claim 2, wherein the first fixing body is located farther away from the center of the hand than the second fixing body when viewed from above.

5. The transfer unit of claim 1, wherein the plurality of fixing members are provided and combined with each other to surround the center of the hand.

6. A transfer unit comprising:
a hand;
an upper fixing member configured to cause a first object to be supported on a top side of the hand by a first support method; and
a lower fixing member configured to cause a second object to be supported on a bottom side of the hand by a second support method,
wherein the first support method and the second support method differ from each other,
wherein the fixing member includes a first electrode and a second electrode,
wherein the transfer unit further includes a voltage applying device configured to apply voltages of different polarities to the first electrode and the second electrode,
a support on which a substrate is placed; and
an edge ring configured to surround the substrate placed on the support,
wherein the edge ring includes:
an inner ring disposed to surround the substrate; and
an outer ring disposed to surround the inner ring,
wherein the transfer unit further includes:
a first fixing body configured to fix the outer ring; and
a second fixing body configured to fix the inner ring, and
wherein the first fixing body and the second fixing body each include the plurality of fixing members.

7. The transfer unit of claim 6, wherein the second support method is a method of supporting the second object by an electrostatic force.

8. The transfer unit of claim 7, wherein the first support method is a method of restricting a lateral movement of the first object by using vacuum pressure or a stopper protruding from the top side of the hand.

9. The transfer unit of claim 6, wherein the first object is different from the second object in terms of shape, material, or area when viewed from above.

10. The transfer unit of claim 9, wherein the first object is a circular substrate, and
wherein the second object is a ring-shaped member having a larger diameter than the substrate.

11. An apparatus for processing a substrate, the apparatus comprising:
a processing unit configured to perform predetermined processing on the substrate; and
a transfer unit configured to transfer the substrate into the processing unit,
wherein the processing unit includes:
a process chamber having a processing space inside;
a support unit configured to support the substrate in the process chamber;
a gas supply unit configured to supply a process gas into the processing space; and
a plasma source configured to generate plasma from the process gas,
wherein the support unit includes:
a support on which the substrate is placed; and
an edge ring configured to surround the substrate placed on the support, the edge ring being detachable from the support, and
wherein the transfer unit includes:
a hand having a top side on which the substrate is placed; and
a fixing member provided in the hand, the fixing member being configured to fix the edge ring to a bottom side of the hand with an electrostatic force,
wherein the fixing member includes a first electrode and a second electrode,
wherein the transfer unit further includes a voltage applying device configured to apply voltages of different polarities to the first electrode and the second electrode,
wherein the edge ring includes:
an inner ring disposed to surround the substrate; and
an outer ring disposed to surround the inner ring,
wherein the transfer unit further includes:
a first fixing body configured to fix the outer ring; and
a second fixing body configured to fix the inner ring, and
wherein the first fixing body and the second fixing body each include the plurality of fixing members.

12. The apparatus of claim 11 wherein the voltage applying device includes:
a first power supply connected to the first fixing body;
a second power supply connected to the second fixing body; and
a controller configured to independently control the first power supply and the second power supply.

13. The apparatus of claim 11 wherein the first fixing body is located farther away from the center of the hand than the second fixing body when viewed from above.

14. The apparatus of claim 11 wherein a plurality of fixing members are provided and combined with each other to surround the center of the hand.

15. The apparatus of claim 11 wherein the fixing member further includes a body protruding downward from the bottom side of the hand, and
  wherein the first electrode and the second electrode are provided in the body.

16. The apparatus of claim 15, wherein the edge ring is a focus ring.

17. The apparatus of claim 15, wherein the edge ring is made of any one of silicon carbide (SiC), silicon (Si), or quartz.

18. A method for processing a substrate using a substrate processing apparatus, wherein the substrate processing apparatus performs predetermined processing on the substrate supported on a support unit in a process chamber having a processing space therein and the support unit includes an edge ring configured to surround the substrate, the method comprising:

a substrate processing step of processing the substrate by generating plasma in the processing space; and
a maintenance step of maintaining the edge ring,
wherein the substrate is supported on a top side of a hand when placed in or extracted from the processing space,
wherein in the maintenance step, the edge ring is extracted from the processing space in a state of being supported on and fixed to a bottom side of the hand,
wherein the edge ring is supported on the bottom side of the hand by an electrostatic force,
wherein the hand includes a first fixing body and a second fixing body, and the first fixing body is located farther away from the center of the hand than the second fixing body,
wherein the edge ring includes:
  an inner ring disposed to surround the substrate; and
  an outer ring disposed to surround the inner ring,
wherein the hand fixes the inner ring with an electrostatic force by the second fixing body when extracting the inner ring from the processing space, and
wherein the hand fixes the outer ring with an electrostatic force by the first fixing body when extracting the outer ring from the processing space.

* * * * *